United States Patent [19]

Grabmaier et al.

[11] 4,330,358
[45] May 18, 1982

[54] METHOD OF PRODUCING PLATE- OR TAPE-SHAPED SILICON CRYSTAL BODIES HAVING CRYSTALLINE PILLAR-LIKE STRUCTURES THEREIN, EQUIVALENT TO CRYSTALLINE COLUMNAR STRUCTURES, FOR LARGE SURFACE SOLAR CELLS

[75] Inventors: Christa Grabmaier, Berg; Franz Otto; Helmut Thomann, both of Munich, all of Fed. Rep. of Germany

[73] Assignee: Siemens Aktiengesellschaft, Berlin & Munich, Fed. Rep. of Germany

[21] Appl. No.: 160,214

[22] Filed: Jun. 17, 1980

[30] Foreign Application Priority Data

Jul. 4, 1979 [DE] Fed. Rep. of Germany ....... 2927086

[51] Int. Cl.³ .......................... H01L 31/18; C03B 1/02
[52] U.S. Cl. ........................... 156/603; 156/DIG. 88; 156/605; 29/572; 136/250; 136/258; 264/63; 264/66; 264/67; 427/74; 427/85; 427/86
[58] Field of Search ............... 156/603, 605, DIG. 88; 136/250, 258; 427/85, 86, 74; 29/572; 264/63, 67, 66

[56] References Cited

U.S. PATENT DOCUMENTS

| | | | |
|---|---|---|---|
| 2,904,613 | 9/1959 | Paradise | 136/250 |
| 3,900,943 | 8/1975 | Sirtl | 136/258 |
| 4,021,323 | 5/1977 | Kilby et al. | 29/572 |
| 4,027,053 | 5/1977 | Lesk | 427/86 |
| 4,173,494 | 11/1979 | Johnson et al. | 427/74 |
| 4,238,436 | 12/1980 | Hill | 427/86 |

FOREIGN PATENT DOCUMENTS

| | | |
|---|---|---|
| 2508803 | 9/1976 | Fed. Rep. of Germany . |
| 2624756 | 2/1977 | Fed. Rep. of Germany ........ 427/86 |

OTHER PUBLICATIONS

Fang et al., "Polycrystalline Silicon Films . . . for Solar Cell Application", Applied Physics Letters, vol. 25, No. 10, Nov. 1974.

Rosenblatt, "Energy Crisis . . . Power Sources", Electronics, pp. 99–111, (Apr. 1974).

Primary Examiner—John D. Smith
Attorney, Agent, or Firm—Hill, Van Santen, Steadman, Chiara & Simpson

[57] ABSTRACT

Selectively shaped silicon crystal bodies, such as plate- or tape-shaped bodies, having crystalline pillar-like structures therein are produced by forming a slurry from an admixture of relatively fine sized silicon particles and a liquid binder, extruding such slurry as a relatively thin layer onto a first support member, drying such extruded layer until it becomes self-supporting and removing such support member, and then sintering such dried layer in a protective gas atmosphere at temperatures below about 1430° C. until a layer of crystalline silicon particles are generated or grown having an average diameter substantially corresponding to the thickness of the dried slurry layer.

22 Claims, 1 Drawing Figure

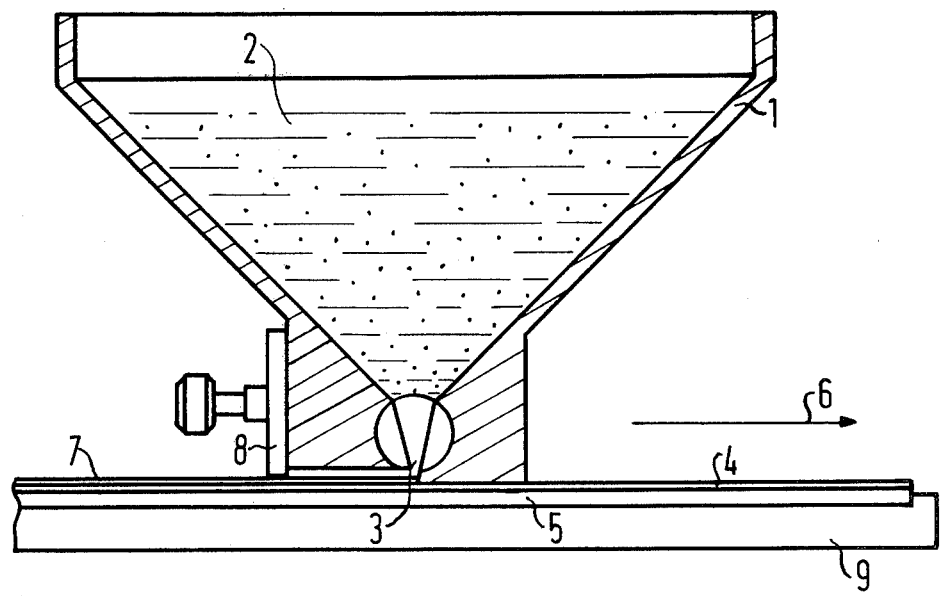

METHOD OF PRODUCING PLATE- OR TAPE-SHAPED SILICON CRYSTAL BODIES HAVING CRYSTALLINE PILLAR-LIKE STRUCTURES THEREIN, EQUIVALENT TO CRYSTALLINE COLUMNAR STRUCTURES, FOR LARGE SURFACE SOLAR CELLS

BACKGROUND OF THE INVENTION

1. Field of the Invention

The invention relates to a process of producing silicon bodies for solar cells and somewhat more particularly to a process of producing plate- or tape-shaped silicon crystal bodies having crystalline pillar-like structures therein, which are equivalent to crystalline columnar structures, and which bodies are useful for further processing into large-surface solar cells without melting of the base material which forms such silicon bodies.

2. Prior Art

In producing solar cells out of silicon, it is desirable to utilize as economical a silicon material as possible because the property requirements of such components, relative to crystal quality, are not as great as those for semiconductor components used in integrated circuits.

Accordingly, it is desirable to find a means of producing silicon crystal bodies in a relatively simple and inexpensive manner to the extent possible and without excessive material loss. Further, such a process should eliminate or minimize expensive work steps, such as for example, sawing of a silicon rod, which is typically produced in accordance with conventional crystal growth techniques, into crystal disks or plates, as well as lapping and/or polishing of such disks.

German Auslegenschrift (hereinafter DE-AS) 25 08 803 suggests that disk- or plate-shaped silicon crystal bodies having monocrystalline columnar structures therein are well suited for fabrication into solar cells having an efficiency greater than about 10%. The process for producing such bodies described in the above-referenced DE-AS comprise pouring a silicon melt into a suitable mold and allowing plate-shaped silicon bodies to solidify. Such bodies have monocrystalline columnar structures extending in a crystallographic privileged direction. From disks sawed-out of such bodies, which previously were of a maximum size of about 120×110 cm², solar cells can be fabricated which have an efficiency which fluctuates between about 8.2% at a cell edge, to about 10.5% at the cell center and thus closely approximates the efficiency of solar cells fabricated out of crystalline silicon (which exhibit an efficiency of about 12 to 14%). The starting material for this mold-pouring process is pre-purified polycrystalline silicon, which is melted in a crucible composed of quartz glass under vacuum or protective gas. In the production of plate-shaped bodies, the silicon melt is poured into suitably shaped and chilled casting dyes or molds which are composed of graphite. In order to avoid reaction between the molten silicon and the mold, it, the mold, is cooled to a substantial degree. This cooling also generates a temperature gradient in the silicon, which causes crystallization and columnar structure formation to begin and continue until solidification of the plate-shaped silicon body is attained. In producing solar cells, disks having a thickness of about 500 μm are sawed-out of such plates with diamond saws conventional in silicon and semiconductor technology.

With the foregoing process, the sawing step required for dividing the plates into disks cannot be eliminated. Further, the size of the plates are determined by the size of the mold necessary for their production.

Another method for producing economical silicon material is set forth in *Electronics*, page 108, Apr. 4, 1974, whereby a polysilicon tape-like body which is at least one meter in length is produced by pouring molten silicon onto a cooled moving support member composed of molybdenum or onto a travelling endless belt coated with a silicon nitride layer, somewhat similar in principle to a conventional conveyor line. However, the resultant silicon material exhibits no crystalline columnar structures and when fabricated into solar cells, displays an efficiency in the range less than about 5%.

SUMMARY OF THE INVENTION

The invention provides a method of producing economical silicon bodies, such as plates or tapes, having crystalline pillar-like structures therein, which are substantially equivalent to the earlier described crystalline columnar structures. Such pillar-like structure-containing silicon bodies are useful for fabricating solar cells having an increased efficiency and such bodies are produced without requiring melting of the base material and without the necessity of sawing, which provides a substantial saving in energy, material and time. Further, with the process of the invention, the prior art solidification and molds which requires additional work steps and devices and which limit the size of the attained silicon plates, are eliminated.

In accordance with the principles of the invention, a slurry is formed from a silicon powder comprised of silicon particles having an average grain size in the range of less than about 1 μm and a compatible liquid binder; a relatively thin layer of such slurry is extruded or drawn-out onto a first inert base member, is dried and the base member removed; such dried slurry layer is then sintered on another or second inert base member in a protective gas atmosphere at a temperature range extending from about 1350° C. to below about 1430° C. in such a manner that a layer of monocrystalline silicon grains are generated having an average diameter which substantially corresponds to the thickness of the dried slurry layer.

In certain embodiments of the invention, as an aid in converting the slurry layer comprised of silicon particles into a silicon body having crystalline pillar-like or pole-like structures (which are equivalent to the crystalline columnar structures) sintering aids, such as arsenic or boron-containing germanium alloys, present in a liquid phase are added to the slurry prior to sintering and/or the temperature distribution within the sintering furnace is adjusted such that monocrystalline pillar-like structures or regions having a crystallographic privileged direction are generated in the thickness direction of the slurry layer via maintenance of a temperature gradient. The starting sintering temperature for growth of silicon grains lies significantly below the melting point of silicon (1430° C.). During such grain growth, the larger grains grow at the expense of the smaller grains until a substantially uniform orientation or distribution over the thickness of the layer is attained.

In certain embodiments of the invention, pillar-like crystalline or monocrystalline regions or structures are attained by providing crystallization seed centers onto the base support used during the sintering process. Such seed centers are periodically spaced in a desired pattern for generating the pillar-like structures. In preferred embodiments, such base support is composed of quartz glass and is provided with uniformly spaced peak-shaped elevations which are suitable for generating the pillar-like structures. Such crystallization seed centers together with a favorable temperature distribution, initiate grain growth on the underside (i.e., the side facing the seed centers) of the silicon slurry layer and cause grain growth to proceed in the thickness directions of such layer.

BRIEF DESCRIPTION OF THE DRAWINGS

The single FIGURE is an elevated, partially cross-sectioned and somewhat schematic view of an arrangement useful for practicing the principles of the invention.

DESCRIPTION OF THE PREFERRED EMBODIMENTS

The illustration, in principal, shows a layer-extruding means or tool for doctorblading for electroceramics which is useful in the practice of the principles of the invention.

A funnel 1 having an adjustable outlet valve 3 is provided with a silicon slurry 2, for example, attained by admixing about 50 grams of a silicon powder (having particles with an average grain diameter smaller than about 1 $\mu$m) with about 30 cubic centimeters of aqueous polyvinyl alcohol (about 5% polyvinyl alcohol, by volume). The silicon slurry can also contain sintering aids which, for example, contain up to a maximum of 5% by weight of germanium (based on the total weight of silicon particles in the slurry) and which can also contain a select dopant for a desired doping of the ultimately attained silicon body. For example, such dopant-sintering aids can comprise arsenic-containing germanium alloys or boron-containing germanium alloys. The slurry 2 exits from funnel 1 via the adjustable outlet valve 3 which, for example, can be adjusted to provide an opening of about 0.4 mm, onto a first inert support member. In an exemplary embodiment, the support member comprises a glass plate 5 coated with a 300 $\mu$m thick Hostaphan (a commercially available polyethylene terephthalate) film. The first inert support member is positioned within an underpart or base 9 of the tool for doctorblading and the upper part of the tool is controllably movable in the direction of arrow 6 so that a slurry layer 7 in a thickness of about 150 $\mu$m is extruded or deposited onto the surface of the support member. A doctor blade means 8 can be provided to meter the slurry and insure the attainment of uniform layer thickness.

After drying in air or in an infrared heater, the slurry layer 7 becomes self-supporting and stable so that it is relatively easy to process further as required. After drying, the Hostaphan film 4 is removed from the layer 7 and the now free, solidified silicon layer is sintered on a second inert support member, for example composed of a quartz glass in a protective atmosphere, such as argon, at a temperature of about 1350° C. for at least about 15 minutes. During sintering, the relatively small silicon particles having a diameter of less than about 1 $\mu$m, consolidate and become so large that particles having a diameter larger than the slurry layer thickness (150 $\mu$m) are attained. This grain growth can be controlled by the sintering aids mentioned earlier, which are present in the slurry layer undergoing sintering as a liquid phase. It will be appreciated that such sintering aids must be distributed as homogeneously as possible in the slurry material. In instances where a dopant is added along with a sintering aid, both of which are admixed with the silicon particles and liquid binder to form a substantially homogenous slurry, the distribution coefficient of such dopant is higher in the liquid phase than in the growing silicon particles so that an enrichment of the dopant can be attained at the growing grain or particle boundaries. In this manner, a substantially homogeneous distribution of the dopant is attained within the silicon layer which is formed from such slurry. In an exemplary, when n-doped silicon bodies are desired, an arsenic-containing germanium alloy (having a maximum of 1% by weight of As therein) is added to the slurry material and when p-doped silicon bodies are desired, a boron-containing germanium alloy (having a maximum of 1% by weight of B therein) is added to the slurry material. Such bodies can be produced in a select random size and p-n junctions can be attained therein by diffusing-in a dopant of the opposing conductivity type.

The inventive method can also be practiced in a continuous matter whereby silicon layers are produced substantially continuously. In one embodiment of such continuous method, the extruding means or drawing-shoe is relatively fixed and the first support or base member is moved in a given direction at a predetermined speed. In another embodiment, the first support or base is relatively fixed and the extruding means is moved parallely along such base member in a given direction at a predetermined speed.

The thickness of the silicon layer can be adjusted as desired via adjustment of the consistency of the slurry, ie., adding more or less liquid binder and/or via adjustment of the extruder valve opening and/or via adjustment of the relative speed between the first base member and the extruding means.

Before subjecting the extruded slurry layer to the earlier described sintering process, if desired, the tape-shaped silicon slurry layer can be simply divided, as with mechanical pressure, into plates or disks of desired dimensions.

- Silicon bodies produced in accordance with the principles of the invention are characterized by a relatively high surface planarity. Further, such bodies can be directly produced in any desired thickness (several hundred $\mu$m) so that sawing, lapping and/or polishing steps typically required in fabricating prior art solar cells, are eliminated. Yet further, because of the presence of the crystalline pillar-like structures in such bodies, solar cells fabricated therefrom exhibit a relatively high efficiency.

As is apparent from the foregoing specification, the present invention is susceptible of being embodied with various alterations and modifications which may differ particularly from those that have been described in the preceeding specification and description. For this reason, it is to be fully understood that all of the foregoing is intended to be merely illustrative and not to be construed or interpreted as being restrictive or otherwise limiting of the present invention, accepting as it is set forth and defined in the hereto-appended claims.

We claim as our invention:

1. A method of producing plate- or tape-shaped silicon crystal bodies having a crystalline pillar structure therein, which is substantially equivalent to crystalline columnar structures, without melting of the base material which forms such silicon bodies and which bodies are useful are processing into large-surface solar cells, comprising:

forming a slurry from an admixture of a silicon powder comprised of silicon particles having an average grain size in a range of less than about 1 μm and a liquid binder;

extruding a relatively thin layer of said slurry and drying said layer until it becomes essentially self-supporting; and sintering such self-supporting slurry layer in a protective atmosphere at sintering temperatures ranging from about 1350° C. to below about 1430° C. in such a manner that a layer of crystalline silicon particles are generated having an average diameter substantially corresponding to the thickness of said dried slurry layer.

2. A method of producing plate- or tape-shaped silicon crystal bodies having crystalline pillar structures therein, which are equivalent to crystalline columnar structures, without melting of the base material which forms such silicon bodies, such bodies being useful for processing into large-surface solar cells, comprising:

forming a slurry from an admixture of a silicon powder comprised of silicon particles having an average grain size in a range less than about 1 μm and a compatible liquid binder;

loading said slurry into a extrusion means having an adjustable outlet opening, said opening being positioned in operating relation with a first inert base support extruding said slurry onto said base support a relatively thin layer, drying said slurry layer into a substantially self-supporting layer and removing said first base member from said self-supporting layer; and sintering such dried slurry layer on a temperature-stable second inert base support in a protective gas atmosphere at sintering temperatures ranging from about 1350° C. to below about 1430° C. in such a manner that a layer of crystalline silicon particles are generated having an average particle diameter corresponding to the thickness of said self-supporting slurry layer.

3. A method as defined in claim 2 wherein during at least said sintering, sintering aids present in a liquid phase are added to said slurry layer.

4. A method as defined in claim 3 wherein said sintering aids are added during formation of said slurry.

5. A method as defined in claim 4 wherein an amount of germanium is added to said slurry as a sintering aid, said amount being equal to a maximum of about 5% by weight based on the total weight of silicon in said slurry.

6. A method as defined in claim 2 wherein said sintering temperature is adjusted within a sintering furnace so that a temperature gradient exists in the thickness dimension of the slurry layer being sintered.

7. A method as defined in claim 2 wherein said second inert base support is composed of quartz glass and is provided with a periodic spacing of crystallization seed centers which promote formation of the crystalline pillar structures.

8. A method as defined in claim 7 wherein said seed centers comprise peak-shaped elevations uniformly spaced on said second base member.

9. A method as defined in claim 2 wherein a select dopant is added during formation of said slurry, said dopant defining the base doping of the formed silicon crystal body.

10. A method as defined in claim 2 wherein a select dopant and a select sintering aid are added during formation of said slurry.

11. A method as defined in claim 10 wherein said slurry includes a sintering aid-dopant material selected from the group consisting of an arsenic-containing germanium alloy and a boron-containing germanium alloy.

12. A method as defined in claim 2 wherein said first inert base support comprises a plastic film.

13. A method as defined in claim 12 wherein said plastic film is composed of polyethylene terephthalate.

14. A method as defined in the preceeding claim wherein plastic film has a thickness in the range of about 100 μm to 700 μm.

15. A method as defined in claim 2 wherein said liquid binder is an aqueous solution of polyvinyl alcohol.

16. A method as defined in claim 2 wherein during extrusion of said slurry onto said first inert base member, said extrusion means is maintained in a fixed position while said first base support is continuously moved in a given direction at a preselected speed.

17. A method as defined in claim 1 wherein during extrusion of said slurry onto said first inert base support, said extrusion means is continuously moved in a given direction at a preselected speed while said first base support is maintained in a fixed position therebeneath.

18. A method as defined in claim 2 wherein the thickness of the slurry layer extruded onto said first base support is selectively adjustable.

19. A method as defined in claim 18 wherein the thickness of the slurry layer is selectively adjustable via adjustment of the consistency of said slurry.

20. A method as defined in claim 18 wherein said thickness of the slurry layer is selectively adjustable via adjustment of the outlet opening and extrusion means.

21. A method as defined in claim 18 wherein said thickness of said slurry layer is selectively adjustable via adjustment of the relative velocity between said first base member and said extrusion means.

22. A method as defined in claim 18 wherein prior to sintering, the dried silicon slurry layer is divided-up into disks or plates of a size corresponding to desired size solar cells.

* * * * *